United States Patent

Cowley et al.

[11] Patent Number: 5,155,455
[45] Date of Patent: Oct. 13, 1992

[54] AM/FM MODULATOR IN WHICH AM CAN BE CONVERTED TO FM BY VECTOR ADDITION

[75] Inventors: Nicholas P. Cowley, Wroughton; Ian G. Watson, Swindon, both of Great Britain

[73] Assignee: Plessey Overseas Limited, England

[21] Appl. No.: 663,869

[22] Filed: Apr. 1, 1991

[30] Foreign Application Priority Data

Aug. 1, 1989 [GB] United Kingdom ................ 8917680

[51] Int. Cl.$^5$ .......................... H03C 3/38; H03C 5/00
[52] U.S. Cl. ..................................... 332/120; 332/135; 332/152; 455/102; 455/108; 455/110
[58] Field of Search ............... 332/120, 121, 145, 151, 332/152, 153, 135; 455/102, 108, 110

[56] References Cited

U.S. PATENT DOCUMENTS 2,978,653  4/1961  Winsor ................................. 332/121
3,002,159  9/1961  Wiancko et al. ..................... 332/121
3,378,773  4/1968  Jeffers ................................. 332/120

FOREIGN PATENT DOCUMENTS 617139  2/1949  United Kingdom ................ 332/120

Primary Examiner—Siegfried H. Grimm
Attorney, Agent, or Firm—Kirschstein, Ottinger, Israel & Schiffmiller

[57] ABSTRACT

A modulator circuit comprises an input for receiving an audio frequency (AF) signal, an oscillator circuit for providing a carrier wave signal, a mixer circuit for mixing the AF input signal with the carrier wave signal to provide an AM modulated signal, a switch having a first position in which the AM modulated signal is provided to an output and the switch having a second position in which the AM modulated signal is provided to a vector adding circuit where the AM modulated signal is vector added to the carrier wave signal, and the circuit including phase shift circuitry for shifting the phase of the AM modulated signal prior to vector adding with the carrier wave signal whereby to provide an FM modulated version of the AF input signal on the oscillator carrier wave.

8 Claims, 4 Drawing Sheets

A = OSCILLATOR VECTOR
B = FED BACK VECTOR
C = RESULTANT OUTPUT

AM/FM MODULATOR IN WHICH AM CAN BE CONVERTED TO FM BY VECTOR ADDITION

BACKGROUND OF THE INVENTION

1. Field of the Invention

This invention relates to a modulator circuit, particularly though not exclusively for modulating sound signals onto a carrier wave for a video recorder system.

2. Description of Related Art

Video recorder systems commonly use a method of FM modulation for modulating an audio frequency (AF) input signal onto a sub-carrier of the video system. Such FM modulators commonly comprise a resonant circuit, such as an L-C circuit with a variable capacitance provided usually in the form of a varactor diode for modulating the resonant frequency of the circuit. One problem with such circuit is that for hi-fidelity reproduction a relatively large deviation or bandwidth is required (75 Kilohertz), and the simple modulating circuit may well introduce non-linearities.

Another problem which arises is that certain countries, for example France have a television standard requiring amplitude modulation (AM) and therefore a video recorder having an FM modulator would not be suitable for use in such countries.

SUMMARY OF THE INVENTION

The object of the present invention is to provide a modulator circuit which can simply be switched between an FM mode of operation and an AM mode of operation depending on the television standard with which the modulator is to be used, and which desirably provides linear modulation over a wide deviation range.

The present invention is based on the recognition that in order to provide an AM mode of operation, a mixer circuit is required to mix the audio frequency (AF) signal with the carrier wave signal, and that this audio modulated signal may be employed to generate a frequency modulated signal by shifting the audio modulated signal in phase and adding the phase shifted signal to the carrier wave signal in order to generate the FM signal.

Accordingly the present invention provides in general terms a modulator circuit comprising an input for receiving an audio frequency (AF) signal, an oscillator circuit for providing a carrier wave signal, a mixer circuit for mixing the AF input signal with the carrier wave signal to provide an AM modulated signal, a switch means having a first position in which said AM modulated signal is provided to an output and said switch means having a second position in which the AM modulated signal is provided to a vector adding means where the AM modulated signal is vector added to the carrier wave signal, and the circuit including phase shift means for shifting the phase of said AM modulated signal prior to vector adding with the carrier wave signal whereby to provide an FM modulated version of the AF input signal on the oscillator carrier wave.

Thus it may be seen in accordance with the invention that two separate modes of operation are provided: firstly an AM mode of operation wherein an AM signal is produced by a conventional mixing process, and secondly an FM mode of operation wherein the mixer is employed in a feedback loop to provide an FM modulated signal.

It may be desirable for the modulator circuit according to the invention to be solely operable in the FM mode, without the AM option being necessary.

Accordingly in a second aspect the invention provides a modulator circuit comprising an input for receiving an audio frequency (AF) signal, an oscillator circuit for providing a carrier wave signal, a mixer circuit for mixing the AF input signal with the carrier wave signal, a phase shift circuit for shifting the phase of the mixed signal relative to the carrier wave signal, and a vector adding circuit for adding the phase shifted mixed signal with the carrier wave signal whereby to provide an FM modulated version of the AF input signal on the oscillated carrier wave.

As preferred, the oscillator circuit will have a linear phase versus frequency response for frequencies within a predetermined range from resonance, and the output of the vector adding circuit will drive the oscillator in order to provide a frequency modulated signal.

Accordingly a third aspect the present invention provides a modulator circuit comprising an input for receiving an audio frequency (AF) signal, an oscillator circuit for providing a carrier wave signal and a linear phase versus frequency response over a predetermined range, a mixer circuit for mixing the AF input signal with the carrier wave signal, phase shift means for shifting the phase of the mixed signal relative to the carrier wave signal, a vector adding circuit for adding the mixed AF signal with the carrier wave signal and applying the vector sum to drive the oscillator, whereby the output of the oscillator provides an FM modulated version of the AF input signal.

The manner of operation of the present invention in the FM mode will be described in outline with reference to FIGS. 1a and 1b. FIG. 1a shows a conventional representation of the frequency modulation process in the complex plane wherein the carrier wave is represented by a vector C which rotates in an anti-clockwise direction with an angular velocity $\omega_c$ and the modulating signal is represented by a vector M which is added to vector C and which rotates about the end of vector C with the modulation angular velocity $\omega_m$. The projection of the vector sum on the x coordinate represents the real value of the amplitude of the signal at any given moment. In accordance with conventional FM theory, the output signal is of constant amplitude but its frequency varies cyclically, the maximum frequency deviation being proportional to the amplitude of the modulating signal M and the rate of change of the frequency deviation being proportional to the frequency of the modulating signal M.

In accordance with the invention, a frequency modulated signal is synthesised by adding to the carrier wave amplitude a vector which is wholly or has a substantial component at right angles to the amplitude vector, such vector having a length proportional to the instantaneous real value of the AF modulating input. This is indicated in FIG. 1b wherein the carrier wave provided by the oscillator is represented by the vector A and the modulating vector is represented by the vector B at right angles to vector A. The addition of these two vectors produces the vector C which is a frequency modulated vector which is provided to the output of the circuit. It may be seen that as compared with FIG. 1a, the vector B does not rotate about the end of the carrier wave vector, but instead oscillates from one side to the other of the vector A. In other words it is the component of the vector M in FIG. 1a which is at right angles to the vector C. This is the component which is important so far as concerns frequency modulation, since the component of the vector M which is parallel to the carrier wave vector is not significant since it merely increases or decreases the magnitude of the carrier wave by a small amount but does not affect the frequency.

BRIEF DESCRIPTION OF THE DRAWINGS

A preferred embodiment of the invention will now be described with reference to the accompanying drawings wherein.

DETAILED DESCRIPTION OF THE PREFERRED EMBODIMENTS

Figure 2:
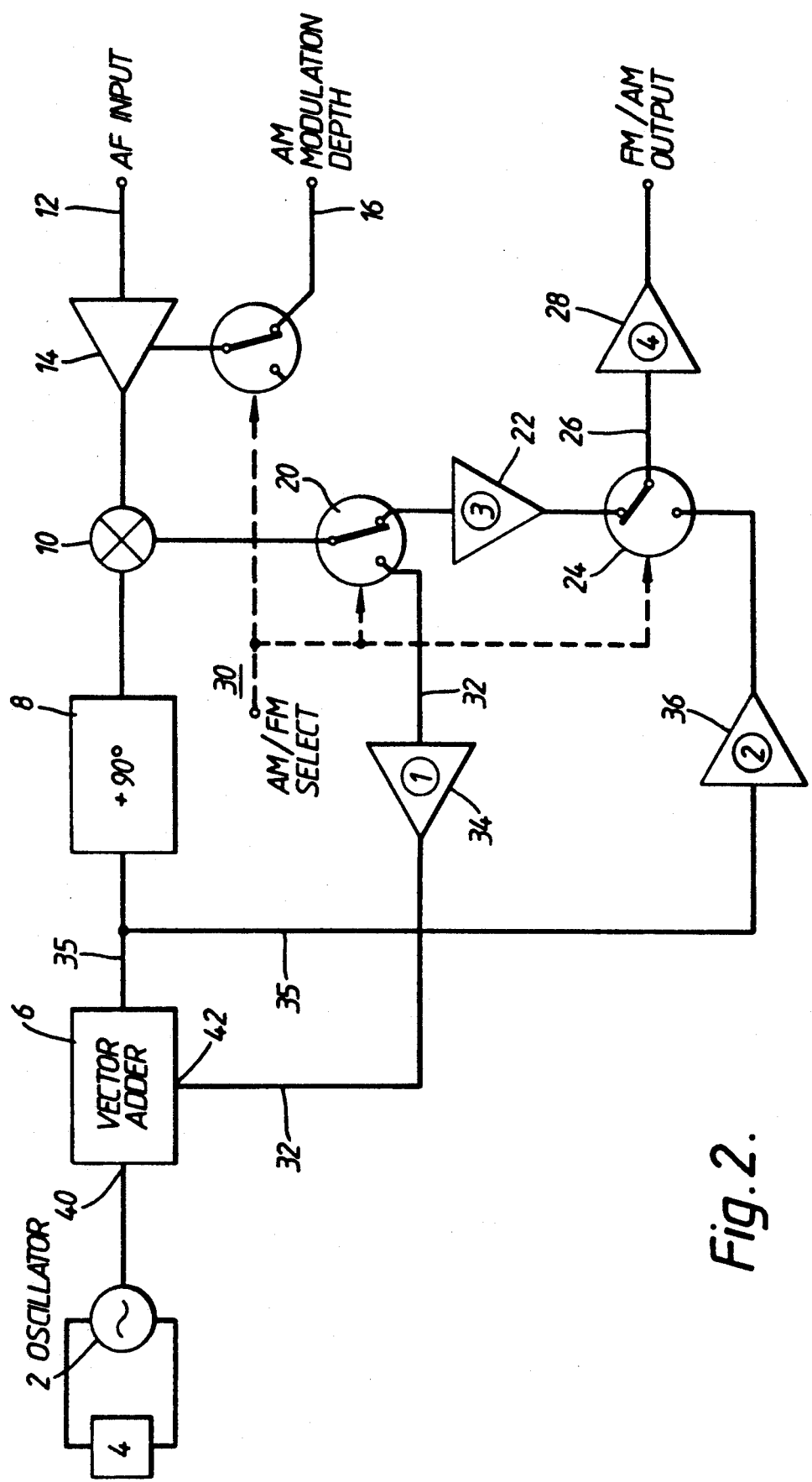
FIG. 2 is a block diagram of a first embodiment of the modulator circuit in accordance with the invention.

Referring now to FIG. 2 there is shown a modulator circuit in accordance with the invention for use in a video recorder wherein the sound is added to the video signal by means of a separate sub-carrier. The circuit shown is adapted to be formed on a single integrated circuit, and an oscillator 2 is formed so that components 4 may be added to the integrated circuit for determining the operating frequency of the oscillator, such as a tank coil or a crystal. Oscillator 2 is connected to an input 40 of a vector adder circuit 6, described below with reference to FIG. 3, and a 90° phase shift circuit 8, which may be a simple R-C network or an active network. Phase shift network 8 is connected to a mixer 10 of suitable form, for example a diode ring or balanced quad where it is mixed with an audio frequency input signal at a terminal 12 coupled to a preamplifier 14 whose output is fed to mixer 10. The gain of amplifier 14 is controlled by a control line 16 via a switch 18.

The output of mixer 10 is applied to a two pole switch 20, one output of the switch being coupled via a gain control amplifier 22 to a further switch 24 to which an output line 26 is coupled having a gain control amplifier 28. Switches 18, 20, 24 are controlled by a single input line 30, termed "AM/FM select". The other output of switch 20 is coupled to a feedback loop 32 having a feedback amplifier 34 to a second input 42 of vector adder circuit 6. The output of vector adder circuit 6 is coupled via an output line 35 and gain control amplifier 36 to the other input of switch 24. The vector adder circuit may be of any convenient form, for example a nodal summing connection.

Figure 1A:
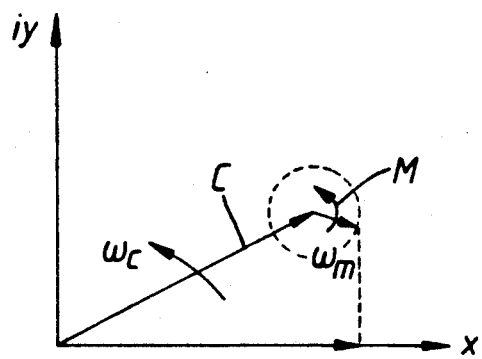
FIGS. 1a and 1b are diagrams illustrating the principle of operation of the present invention.
Figure 1B:
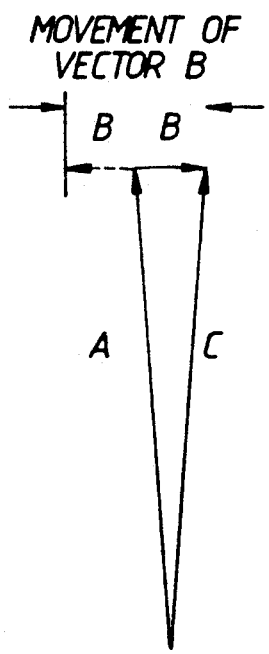

Thus in operation of the circuit of the present invention, the AM/FM select line 30 is actuated to determine whether AM or FM modulation is to be produced. For FM modulation, switch 20 couples mixer 10 to feedback line 32 and switch 24 couples output line 26 to FM output line 35. Referring to FIG. 1b, the output vector C available on line 35 is shifted in phase by 90° in phase shifter circuit 8 and applied to one input of mixer 10 where it is mixed with the modulating AF input signal. Thus the output of mixer 10 is a vector at right angles to the carrier wave signal and has an amplitude which is proportional to the AF input signal. This signal is represented by vector B in FIG. 1b. This signal is applied via feedback line 32 to input 42 of the vector adder circuit 6. Vector adder circuit 6 is operative above to add the carrier wave vector A to the modulating vector B to produce the output vector C which is available on line 35 and is applied via gain control amplifier 36 to the output line 26. Thus effectively the output of the oscillator 2 is modulated in phase by the addition of vector B to provide a resultant FM modulation.

In the AM mode of operation, select line 30 is suitably actuated so that switch 18 is coupled to control line 16, switch 20 is coupled to amplifier 22 and feedback line 32 is disabled, and amplifier 22 is coupled to output line 26. This is the AM mode of operation and the signal on control line 16 controls the modulation depth of the modulating signal applied to mixer 10. The carrier wave from oscillator 2 is applied to the other input of mixer 10 via vector adder circuit 6, vector adder circuit 6 however being disabled since no input is provided on feedback line 32. Thus a conventional mixing process is provided and the AM modulated signal is provided at the output from mixer 10 to output line 26.

Figure 3:
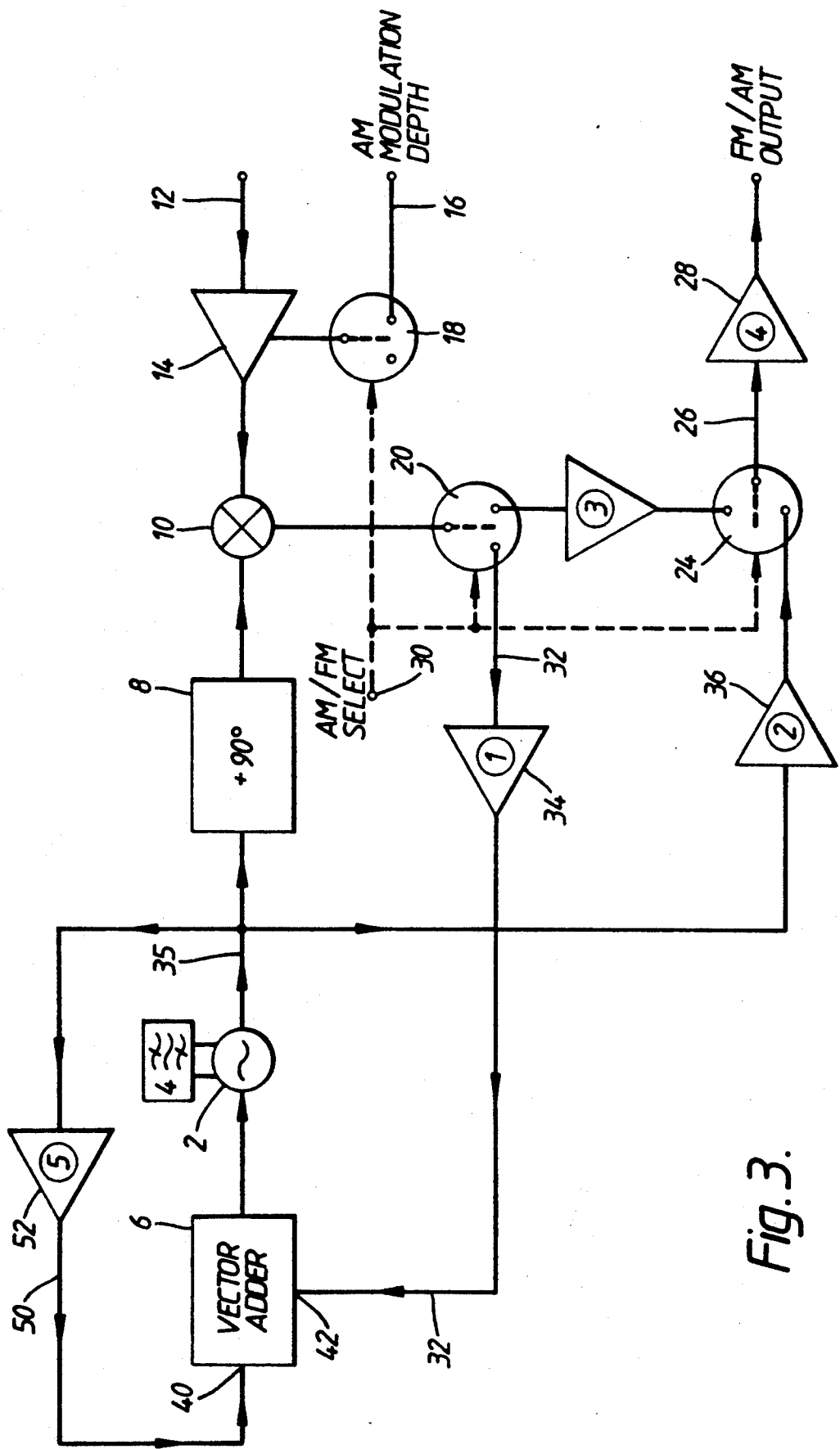
FIG. 3 is a block diagram of a second embodiment of the invention.

Referring now to FIG. 3 it shows a second embodiment of the invention, similar parts to those of FIG. 2 are indicated by the same reference numeral. The embodiment of FIG. 3 differs principally in the oscillator circuit 2 being driven by the output of vector adder circuit 6, with the input 40 of vector adder circuit 6 being provided with an output signal from the oscillator 2 via a feedback loop 50 containing a gain control amplifier 52. Thus if the signal at input 40 is $A \sin \omega T$ and the signal at input 42 is $B \cos \omega T$, where B is a function depending on the audio input ($B a V_m \cos \omega_m t$) then the output of the vector adder circuit is as follows:

$$C = A\sin\omega t + B\cos\omega t$$
$$= \sqrt{A^2 + B^2} \; \sin(\omega t + \phi); \; \phi = \mathrm{Tan}^{-1} B/A$$

For resonable frequency deviation, the maximum $B \approx 0.2\, A$ $$\therefore \sqrt{A^2 + B^2} \sim A \text{ also } \mathrm{Tan}^{-1} B/A \sim B/A \text{ (radians)}$$

$$C = A\sin(\omega t + B/A)$$

The oscillator provides a reactive load with a phase-frequency response, closely approximated by $\phi = -K(\omega - \omega_c)$ where $\omega c$ is the central carrier frequency of the oscillator. For the small frequency deviations of interest, the amplitude of the oscillation around the central frequency $\omega c$ remains constant.

Thus the oscillator's function is $$C = A\sin(\omega t + B/A) \rightarrow A\sin(\omega t + B/A - K\delta\omega) = A\sin\omega t$$
$$\delta\omega = (\omega - \omega_c)$$
only when $B/A = k\delta\omega$ or $\delta\omega = B/Ak$
But $B a V_m \cos\omega_m t = \text{A.F.}$ or $\delta \omega a \text{A.F.}$ i.e. FM modulation by vector addition. Linearity depends on the oscillator's phase-frequency response.

Figure 4:
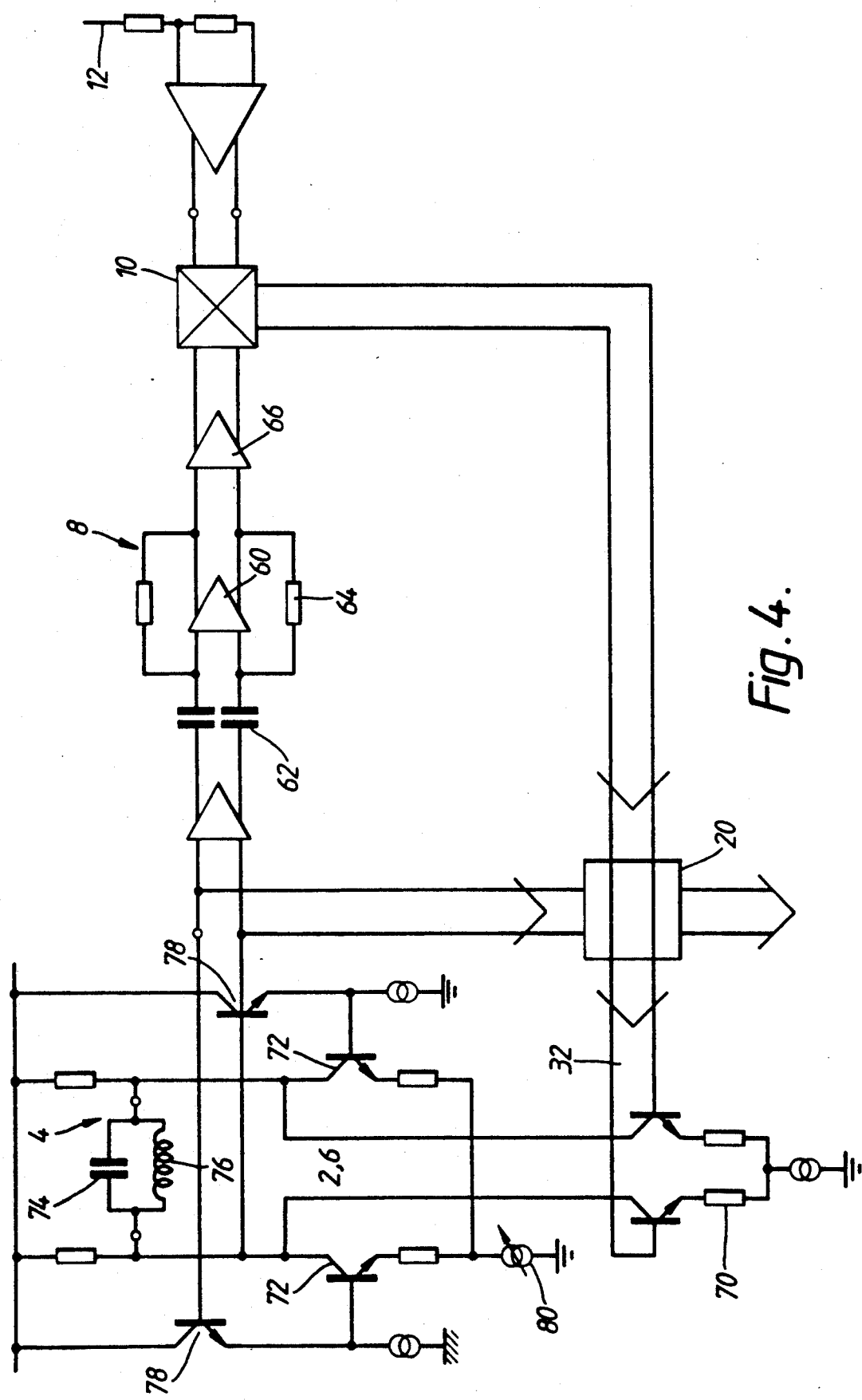
FIG. 4 is a circuit diagram of a third embodiment of the invention.

Referring now to FIG. 4 there is shown a circuit diagram of the third embodiment of the invention, similar parts to those of FIGS. 2 and 3 being indicated by the same reference numerals. The phase shift circuit 8 is provided by a transimpedance amplifier 60 coupled to phase shift capacitors 62 and having feedback resistors 64. A voltage to current converter circuit 66 is provided for providing a signal to the mixer circuit 10.

The feedback signal on line 32 is fed to a differential amplifier drive circuit 70 whose collectors are coupled to the collectors of a differential pair 72 of an oscillator circuit 6, the oscillator circuit having a resonant circuit 4 comprising a capacitor 74 and an inductance 76 coupled between the collectors of the differential pair 72. The collectors of the differential pair 72 are cross-coupled to the respective bases via transistors 78. The differential pair 72 has a current source 80 in the tail which is controlled by an automatic gain control circuit.

Thus in this embodiment, oscillations are sustained in the absence of modulation by the positive feedback loops back to the bases of transistors 72. When a modulated signal is applied via feedback loop 32, signals are provided via drive circuit 70 to the collectors of pair 72, which modulating signals are 180° out of phase with each other and 90° out of phase with the oscillator signal generated within oscillator 2. The connection to the collectors of transistor pair 72 thus provides a vector adding circuit and the modulated signals added to the resonant circuit provide frequency deviation from the resonant frequency, and by virtue of the linear phase versus frequency response of the circuit over a predetermined range, a frequency deviation is generated within the oscillator which is proportional to the phase deviation provided by the modulated signal.

Thus this invention relates to a desing of modulator circuit capable of producing both AM or FM modulated outputs and is designed to be very suitable for up integration. It is principally intended for performing the sound sub-carrier modulation in video modulator circuits, though will have applications wherever a good AM and/or FM modulation is required.

The circuit is designed with minimum external components, simply requiring an external tank coil for the oscillator section. It is also designed to be simple in it's application having one AF input for both modulation types and one RF output. A further input is provided for setting the AM modulation depth; in the intended video modulator application this would be a fixed level so would come from an internally generated source. The setting of the AM modulation depth can be achieved through the AF input if a further input is not wanted. The modulation generated is simply selected by the AM/FM select input.

Its main advantages are;
1) ease of application
2) excellent distortion characteristics
3) low fundamental oscillator radiation
4) no higher frequency modulation products, achieved by use of soft switching. This eliminates the need for complex post filtering.
5) simple switching from FM to AM modulation
6) simple control of AM modulation depth
7) excellent noise performance FM operation mode—FM modulation is achieved by using vector addition techniques. The carrier is generated by the internal oscillator circuit, which is designed to have low radiation and a substantially constant output amplitude. This signal is fed to a vector summer then to a 90° degree phase shift network. The oscillator is looped together with the vector adder, and the oscillator's output is then fed to a 90° phase shift network. A proportion of the output of this circuit is then fed to the other input of the vector summer. The feed back signal is proportional to the magnitude of the AF input, therefore the output of the vector summer will be a frequency modulated signal with the degree of deviation being proportional to the AF amplitude and the frequency of the modulation being equal to the AF. The resultant FM output is then fed via gain stages to the FM/AM output.

The magnitude of the feedback signal is controlled by a simple AM modulator. The modulator needs to be a dual sideband mixer with no carrier breakthrough i.e. a double balance mixer. As no carrier breaks through, modulation depth is a mathematical non entity due to a division by zero. A simple gain stage sets the maximum peak deviation for peak AF input.

AM operation mode—AM modulation is achieved by using the feedback control elements of the FM mode, which is a basic AM modulator. In this mode the feedback path is disabled so there is no residual FM. An offset must also be introduced into the AF signal to set the required modulation depth. The output of the modulator is then fed to the FM/AM output via gain stages.

The gain stages are ratioed such that peak AM modulation is the same amplitude as the FM modulation.

We claim:

1. A modulator circuit, comprising: an input for receiving an audio frequency (AF) signal; an oscillator circuit including transistor means having a resonant circuit coupled as a collector load, the oscillator circuit providing a carrier wave signal and having a linear phase versus frequency response over a predetermined range; a mixer circuit for mixing the AF input signal with the carrier wave signal; phase shift means for shifting the phase of the mixed signal relative to the carrier wave signal; and a vector adding circuit comprising a nodal connection for coupling the mixed AF signal to said collector load, whereby the mixed AF signal is added together with the carrier wave signal and the vector sum applied to drive the oscillator circuit, the output of the oscillator circuit providing an FM modulated version of the AF input signal.

2. A modulator circuit as claimed in claim 1 wherein said phase shift means is connected between the output of the oscillator circuit and the input to the mixer circuit.

3. A modulator circuit as claimed in claim 1 wherein the AF input includes an amplifier with a control input for determining gain, and wherein the output of the mixer circuit is coupled to a gain control amplifier.

4. A modulator circuit as claimed in claim 1 wherein the transistor means comprises a first long tailed pair connected in differential configuration and the mixed AF signal is applied to a second long tailed pair connected in differential configuration whose collectors are coupled to the collectors of the first long tailed pair.

5. A modulator circuit as claimed in claim 1 wherein the phase shift means comprises capacitance means coupled to amplifier means for providing an accurately controlled 90° phase shift.

6. A modulator circuit as claimed in claim 1 wherein the modulator circuit is formed on an integrated circuit with the frequency determining components of the oscillator circuit being external of the integrated circuit.

7. A modulator circuit as claimed in claim 1 formed in a video recorder.

8. A modulator circuit as claimed in claim 1, wherein there are provided switch means having a first position in which said mixed AF signal is applied to an output of the modulator circuit as an amplitude modulated output signal and a second position in which said mixed AF signal is applied to said vector adding circuit.

* * * * *

UNITED STATES PATENT AND TRADEMARK OFFICE
CERTIFICATE OF CORRECTION

PATENT NO. : 5,155,455
DATED : October 13, 1992
INVENTOR(S) : Nicholas P. Cowley, et al It is certified that error appears in the above-indentified patent and that said Letters Patent is hereby corrected as shown below:

On the title page, items:

[22]    PCT Filed: Aug. 1, 1990

[86]    PCT No.    PCT/GB90/01195
               371 Date:  Apr. 1, 1991
               102(e)Date: Apr. 1, 1991

[87]    PCT Pub. No.  WO91/02404
            PCT Pub. Date: Feb. 21, 1991

[30]    Foreign Application Priority Data
            Aug. 2, 1989 (GB) ... 8917680

Signed and Sealed this

Twenty-sixth Day of October, 1993

Attest:

BRUCE LEHMAN

*Attesting Officer*      *Commissioner of Patents and Trademarks*